(12) United States Patent
Messenger et al.

(10) Patent No.: US 7,616,013 B2
(45) Date of Patent: Nov. 10, 2009

(54) MICROMECHANICAL POSITIONAL STATE SENSING APPARATUS METHOD AND SYSTEM

(75) Inventors: Robert K. Messenger, Springville, UT (US); Timothy W. McLain, Provo, UT (US); Jeffrey K. Anderson, Provo, UT (US); Larry L. Howell, Orem, UT (US)

(73) Assignee: Brigham Young University, Provo, UT (US)

( * ) Notice: Subject to any disclaimer, the term of this patent is extended or adjusted under 35 U.S.C. 154(b) by 0 days.

(21) Appl. No.: 11/271,541

(22) Filed: Nov. 11, 2005

(65) Prior Publication Data
US 2006/0097727 A1    May 11, 2006

Related U.S. Application Data

(60) Provisional application No. 60/735,408, filed on Nov. 9, 2005, provisional application No. 60/627,736, filed on Nov. 11, 2004.

(51) Int. Cl.
*G01R 27/08* (2006.01)
(52) U.S. Cl. .................. 324/691; 324/415; 324/727
(58) Field of Classification Search .............. 324/415, 324/418, 762, 691, 725, 666; 977/732, 724
See application file for complete search history.

(56) References Cited

U.S. PATENT DOCUMENTS

| | | | | |
|---|---|---|---|---|
| 5,355,712 A | * | 10/1994 | Petersen et al. | 73/1.38 |
| 5,445,006 A | * | 8/1995 | Allen et al. | 73/1.38 |
| 5,489,774 A | * | 2/1996 | Akamine et al. | 250/234 |
| 5,726,480 A | * | 3/1998 | Pister | 257/415 |
| 6,199,874 B1 | * | 3/2001 | Galvin et al. | 280/5.514 |
| 6,327,909 B1 | * | 12/2001 | Hung et al. | 73/514.16 |
| 6,969,996 B2 | * | 11/2005 | Staple et al. | 324/415 |
| 7,170,141 B2 | * | 1/2007 | Kornegay et al. | 257/419 |
| 2005/0150280 A1 | * | 7/2005 | Tang et al. | 73/105 |

OTHER PUBLICATIONS

Howell, Larry L., Compliant Mechanisms, John Wiley & Sons, Inc., 2001, p. 355-369.*
Hwang, Eun-Soo et al. "Flexible polysilicon strain gauge array" Jpn. J. Appl. Phys. vol. 42, 2003, pt. 2, No. 7B, p. L810-813.*
Messenger, R.K., McLain, T.W., Howell, L.L., "Improved Nanopositioning Resolution through Piezoresistive Feedback Control of a MEMS Thermal Actuator," submitted for publication in the *Proceedings of the 2005 ASME International Mechanical Engineering Congress and Exposition*, IMECE2005-81209.
Messenger, R.K., McLain, T.W., Howell, L.L., "Feedback Control Using Piezoresistive Micro-Displacement Sensing," *Proceeding of IMECE 2004*, IMECE2004-59810.

* cited by examiner

*Primary Examiner*—Thomas F. Valone
(74) *Attorney, Agent, or Firm*—Steve McDaniel; Utah Valley Patent

(57) ABSTRACT

A micromechanical device may include one or more piezoresistive elements whose electrical resistance changes in response to externally or internally induced strain. The present invention leverages the piezoresistive properties of such devices to sense the positional state of the device. A sensing circuit may be integrated into the device that senses an electrical resistance of at least a portion of the micromechanical device and provides information regarding the positional state of the micromechanical device. The micromechanical device may be a compliant device that includes relatively flexible members such as mechanical beams or ribbons. The positional states may be continuous positional states (such as the position of an actuator) or discreet positional states (such as the positional state of a bistable memory device). In certain embodiments, the micromechanical device is a threshold detector that latches to a particular stable configuration when an applied force exceeds a selected value.

8 Claims, 5 Drawing Sheets

MICROMECHANICAL POSITIONAL STATE SENSING APPARATUS METHOD AND SYSTEM

RELATED APPLICATIONS

This application claims priority to U.S. Provisional Patent Application No. 60/627,736 entitled "Piezoresistive Micro Displacement MEMS Sensing" and filed on 11 Nov. 2004 for Robert K. Messenger, Timothy W. McLain, and Larry L. Howell, and to U.S. Provisional Patent Application No. 60/735,408 entitled "Piezoresistive Sensing of Bistable Micro Mechanism State" filed 9 Nov. 2005 for Jeffrey Anderson, Larry L. Howell, Timothy W. McLain, and Robert Messenger. Each of the aforementioned applications is incorporated herein by reference.

GOVERNMENT LICENSE

The U.S. Government has a paid-up license in this invention and the right in limited circumstances to require the patent owner to license others on reasonable terms as provided for by the terms of Grant No. CMS-0428532 awarded by the National Science Foundation.

BACKGROUND OF THE INVENTION

1. Field of the Invention

This invention relates generally to micro-electro-mechanical systems (MEMS) and more particularly relates to apparatus, systems, and methods for positional sensing of micromechanical elements.

2. Description of the Related Art

Micro-electro-mechanical systems (MEMS) are typically fabricated using semiconductor processes that etch away and dope selected areas to form electrical and mechanical devices on a common substrate. The integration of electrical and mechanical devices facilitates providing low-cost high performance components. Typical applications include sensors, transducers, accelerometers, optical switching, and multi-colored projection.

One issue related to controlling the mechanical devices on MEMS chips is sensing the position of various mechanical elements and adjusting their position to achieve a desired position. In particular, the small geometries involved with MEMS systems impose significant challenges to sensing the position of mechanical elements in a cost effective manner. For example, optical techniques used in large scale applications are typically impractical for the small scales involved with MEMS devices. As a result, a need exists for an apparatus, system, and method to sense the positional state of a micromechanical device in a cost effective manner.

SUMMARY OF THE INVENTION

The present invention has been developed in response to the present state of the art, and in particular, in response to the problems and needs in the art that have not yet been fully solved by currently available MEMS devices and methods. Accordingly, the present invention has been developed to provide an apparatus, method, and system to sense a positional state of a micromechanical device that overcome many or all of the above-discussed shortcomings in the art.

In one aspect of the present invention, an apparatus to sense a positional state of a micromechanical device includes a micromechanical device comprising a piezoresistive material, the micromechanical device configured to have a plurality of positional states, and a sensing circuit configured to sense an electrical resistance of at least a portion of the micromechanical device. In some embodiments, the micromechanical device may be formed entirely of a piezoresistive material such as polysilicon and possess substantially homogeneous piezoresistive properties that are leveraged to sense the positional state of the device.

The micromechanical device may be a compliant device comprised of one or more relatively flexible members such as mechanical beams, strips, or ribbons. In certain embodiments, the micromechanical device is a threshold detector that latches to a particular stable configuration when an applied force exceeds a selected value. The electrical resistance of the micromechanical device (or a selected portion of the micromechanical device) may correspond to the amount of strain within the micromechanical device and therefore the positional state. The positional states may be continuous positional states (such as the position of an actuator) or discreet positional states (such as the positional state of a bistable memory device).

To increase sensitivity, the sensing circuit may be electrically connected across the longest dimension of the micromechanical device. In one embodiment, the sensing circuit comprises a Wheatstone bridge wherein one branch of the Wheatstone bridge comprises a portion of the micromechanical device.

In another aspect of the present invention, a method to sense a positional state of a micromechanical device includes providing a micromechanical device comprising a piezoresistive material, the micro-mechanical device configured to have a plurality of positional states, and sensing the electrical resistance of at least a portion of the micromechanical device. The method may also include detecting a positional state of the micromechanical device from the sensed electrical resistance.

In another aspect of the present invention, a system to sense a positional state of a micromechanical device includes a micromechanical device having piezoresistive properties, a sensing circuit configured to sense an electrical resistance of at least a portion of the micromechanical device, and a processing module configured to receive a signal from the sensing circuit and detect a positional state of the micromechanical device. The positional state of the micromechanical device may be sensitive to various actuation means such as pressure, temperature, force, acceleration, voltage, current, light, magnetic fields, thermal radiation, and the like.

The present invention facilitates sensing a positional state of a micromechanical device in a non-obtrusive cost effective manner. It should be noted that references to features, advantages, or similar language within this specification does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The aforementioned features and advantages of the present invention will become more fully apparent from the following description and appended claims, or may be learned by the practice of the invention as set forth hereinafter.

BRIEF DESCRIPTION OF THE DRAWINGS

To enable the advantages of the invention to be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Some of the functional units described in this specification have been explicitly labeled as modules, (while others are assumed to be modules) in order to emphasize their implementation independence. For example, a module may be implemented as a hardware circuit comprising custom VLSI circuits, MEMS devices, or gate arrays, off-the-shelf semiconductors such as logic chips, transistors, or other discrete electrical or mechanical components. A module may also be implemented in programmable hardware devices or systems such as field programmable gate arrays, programmable array logic, and programmable logic devices.

Modules may also be implemented in software for execution by various types of processors such as embedded processing units, microcontrollers, or the like. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Figure 1:
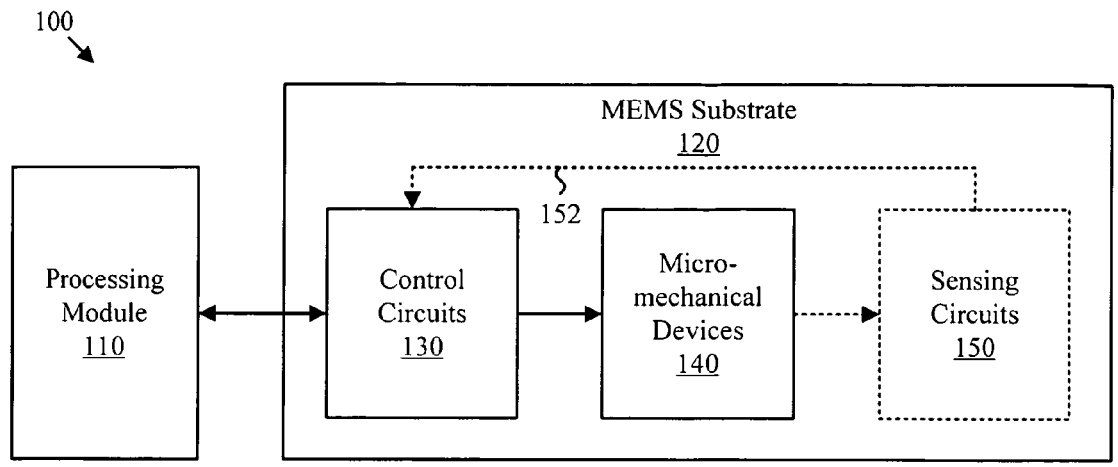
FIG. 1 is a block diagram depicting one embodiment of a prior art MEMS control system.

FIG. 1 is a block diagram depicting one embodiment of a MEMS control system 100. As depicted, the MEMS control system 100 includes a processing module 110, and a MEMS substrate 120 with one or more control circuits 130, micromechanical devices 140, and in some embodiments one or more sensing circuits 150. The MEMS control system 100 illustrates a typical approach to controlling the micromechanical devices 140.

The processing module 110 may receive sensor information and provide control information in the form of digital or analog signals, or other means known to those of skill in the art. The control circuits 130 control the micromechanical devices 140 as directed by the processing module 110. For example, the control circuits 130 may activate mechanical actuators or switches that control the position and orientation of optical or mechanical elements. In some embodiments, the sensing circuits 150 sense the position of the micromechanical devices 140 and provide feedback information 152 to the control circuits 130.

Figure 2:
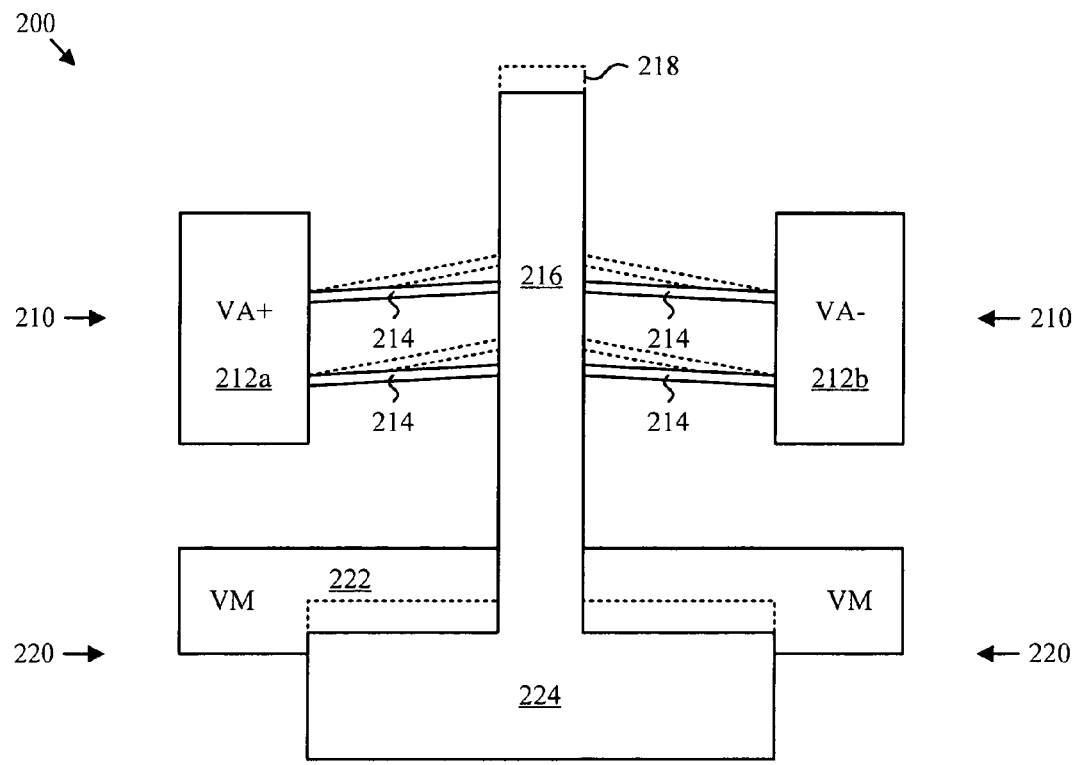
FIG. 2 is a layout diagram depicting one example of a MEMS positional sensor.

FIG. 2 is a layout diagram depicting one example of a MEMS positional sensing device 200. As depicted, the positional sensing device 200 includes a thermal actuator 210 and a capacitive sensor 220. The positional sensing device 200 facilitates providing positional feedback corresponding to the positional state of the thermal actuator 210.

The thermal actuator 210 includes a pair of actuation signal pads 212a and 212b that receive a differential control signal (not shown) that provides current to a set of beams 214. The beams 214 may be thermally heated and elongated proportional to the current provided to the signal pads 212. The elongation of the beams 214 may actuate a movable shuttle 216 to a new position 218.

The depicted capacitive sensor 220 includes a lower plate 222 and an upper plate 224 integrally formed with the movable shuttle 216. As the overlap between the upper plate 224 and the lower plate 222 changes, a change in capacitance may be sensed by an appropriate sensing circuit 150 (see FIG. 1) connected to the lower plate 222. In turn, the control circuits 130 or the processing module 110 (see FIG. 1) may receive the capacitance information and estimate the position of the movable shuttle 216.

Although the positional sensing device 200 provides valuable feedback, significant circuitry may be required to support the positional sensing device 200. For example, sensing the capacitance between the upper plate and the lower plate may require generation of an AC signal comprising one or more high frequency components. Furthermore, stray capacitance and other non-linear effects may necessitate significant calibration and/or signal processing to provide an accurate estimate of the position of the movable shuttle 216. In addition, significant substrate real estate may be consumed by the capacitive sensor 220 and its associated support circuitry.

Furthermore, additional layers, processing steps, or materials may be required to properly fabricate the capacitive sensor 220.

Figure 3:
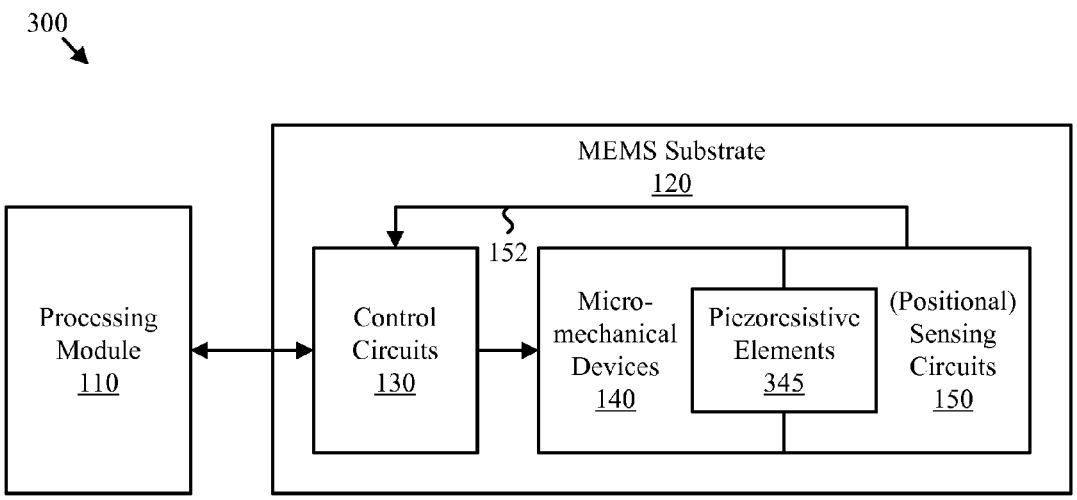
FIG. 3 is a block diagram depicting one embodiment of a MEMS control system of the present invention.

As subsequently described and claimed herein, various embodiments of the present invention address many of the aforementioned issues. FIG. 3 is a block diagram depicting one embodiment of a MEMS control system 300 of the present invention. In addition to the elements described in conjunction with the MEMS control system 100 or similar elements, the MEMS control system 300 includes one or more piezoresistive elements 345 that may be integrated into the micromechanical devices 140 and/or the sensing circuits 150. Piezoresistive elements experience changes in electrical resistance in response to changes in strain.

The piezoresistive elements 345 may be constructed of the same material as the micromechanical devices 140. In one embodiment, the micromechanical devices 140 are fabricated from one or more layers of polysilicon. By sensing the electrical resistance of the piezoresistive elements 345 (and therefore the mechanical strains within the micromechanical devices 140), information and/or feedback corresponding to the positional states of the micromechanical devices 140 may be provided to the controls circuits 130 and/or the processing module 110. In certain embodiments, the correspondence between the feedback information and the micromechanical states may be substantially linear. In some embodiments, the piezoresistive elements that are measured include primarily those portions of the micromechanical devices (such as beams) that experience significant changes in strain in response to changes in positional state.

Figure 4:
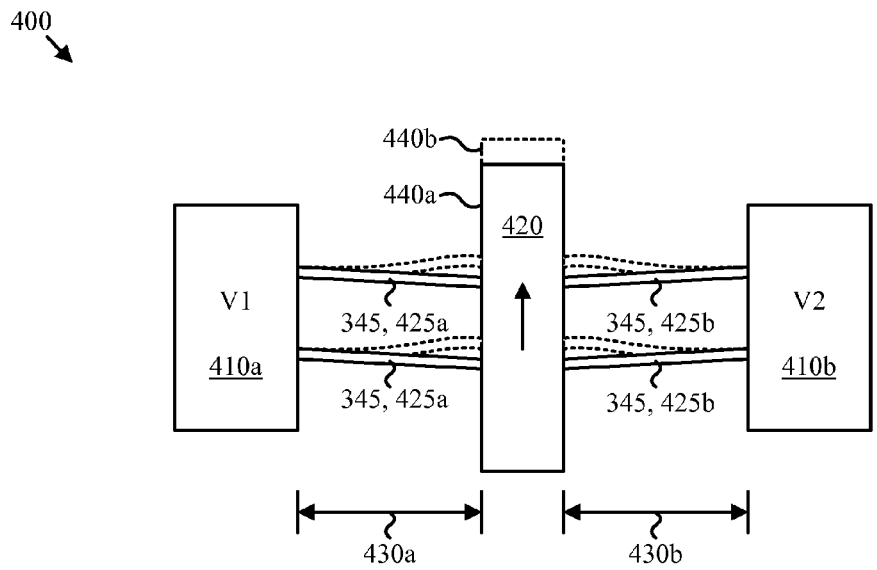
FIG. 4 is a layout diagram depicting one embodiment of a MEMS positional sensing device of the present invention.

FIG. 4 is a layout diagram depicting one embodiment of a positional sensing device 400 of the present invention. As depicted, the positional sensing device 400 includes a pair of stationary pads 410a and 410b, a movable shuttle 420, and one or more piezoresistive elements 345. The positional sensing device 400 is one example of a MEMS device that leverages the piezoresistive elements 345 for both mechanical structure and electronic feedback purposes—a concept the applicants consider unique to the present invention.

The stationary pads 410a and 410b may receive a sensing signal from a sensing circuit used to estimate the electrical resistance of the device 400 in general and of the piezoresistive elements 345 in particular. To increase sensitivity, the sensing circuit may be electrically connected across the longest dimension of the device 400.

The movable shuttle 420 may be moved by an external force such as acceleration, or by forces imposed by other elements integrated onto the MEMS substrate 120. Such forces may induce movement on the shuttle 420 and a corresponding strain on the piezoresitive elements 345 and cause the device 400 to assume a particular positional state.

In certain embodiments, the positional sensing device 400 is a bistable device. For example, the device 400 may be a compliant bistable device that is induced into the stable positional state 440b when the device is subjected to acceleration that exceeds a selected threshold. In the depicted embodiment, the piezoresistive elements 345 are elongated beams 425 having a length to width ratio of greater than 5 and the device 400 has bistable positional states 440a and 440b. The first stationary pad 410a may be separated from the moveable shuttle 420 by a first separation distance 430a and the second stationary pad 410b may be separated from the moveable shuttle 420 by a second separation distance 430b. The length of the beams 425a that connect the first stationary pad 410a to the movable shuttle may be longer than the first separation distance 430a. Similarly, the length of the beams 425b that connect the second stationary pad 410 b to the movable shuttle may be longer than the second separation distance 430b. The beams 425 and the moveable shuttle 420 interact mechanically and essentially form a plurality of interacting elements within the device 400. Having beams 425 that are longer than the separation distance that they span facilitates providing two mechanically stable positions for the movable shuttle corresponding to the positional states 440a and 440b for the device 400. As is depicted in FIG. 4, in the first stable position the elongated beams have an unbent shape while the elongated beams have a slight 'S' shape for the second stable position. The stable positions or states 440a and 440b may be maintained without consuming power and without an electrostatic force acting on the device 400 or the elements thereof. The bulk piezoresistivity across the device 400 and/or the plurality of interacting elements can be measured via the stationary pads 410 (i.e. across the stationary pads 410a and 410b) to sense whether the device 400 is in the first stable state 440a or the second stable state 440b. For more information on compliant devices and discrete positional states, the reader is referred to the textbook *Compliant Mechanisms* authored by one of the applicants (Larry L. Howell) and published by John Wiley and Sons, Inc.

In certain embodiments, the positional sensing device 400 is a bistable device. For example, the device 400 may be a compliant bistable device that is induced into the stable positional state 440b when the device is subjected to acceleration that exceeds a selected threshold. In the depicted embodiment, the device 400 has bistable positional states 440a and 440b. In another embodiment, the device 400 is a tristable device. For more information on compliant devices and discrete positional states, the reader is referred to the textbook *Compliant Mechanisms* authored by one of the applicants (Larry L. Howell) and published by John Wiley and Sons, Inc.

The sensing signal (not shown) provided to the stationary pads may be used to measure the electrical resistance of one or more of the piezoresistive elements 345. For example, in one embodiment, a pair of DC reference voltages (one of which may be a ground voltage) are applied to the pads 440 and the current flowing through the device 400 is measured to estimate the positional state of the device 400. The use of DC reference voltages may simplify circuit design and circuit layout.

Figure 5:
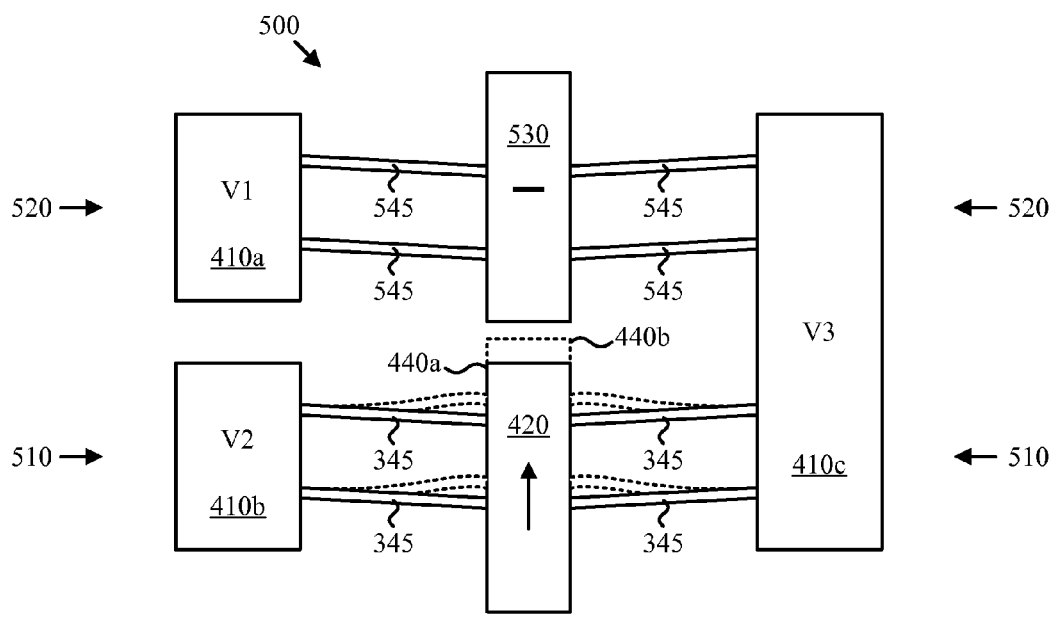
FIG. 5 is a layout diagram depicting another embodiment of a MEMS positional sensing device of the present invention.

FIG. 5 is a layout diagram depicting another embodiment of a positional sensing device of the present invention, namely, the positional sensing device 500. In addition to the elements of the sensing device 400 or similar elements, the sensing device 500 includes an active device 510 and a reference device 520. The active device 510 may assume a number of positional states that change the electrical resistance of the device. Use of the reference device 520 may normalize measurement of the electrical resistance of the piezoresistive elements 345.

The depicted reference device 520 includes a stationary element 530 that anchors the reference device 520 into a certain positional state. The reference device 520 may also include a set of piezoresistive reference elements 545 that are substantially identical to the piezoresistive elements 345 yet held in a constant positional state. As a result, the depicted sensing device 500 may function as a voltage divider wherein a voltage measured at a measurement pad 410c may be proportional to the ratio of the resistance of one of the devices to the total resistance of both devices. The use of such a voltage divider may factor out process variations and environmental factors such as humidity, and facilitate more accurate measurement of the positional state of the active device 510.

Figure 6:
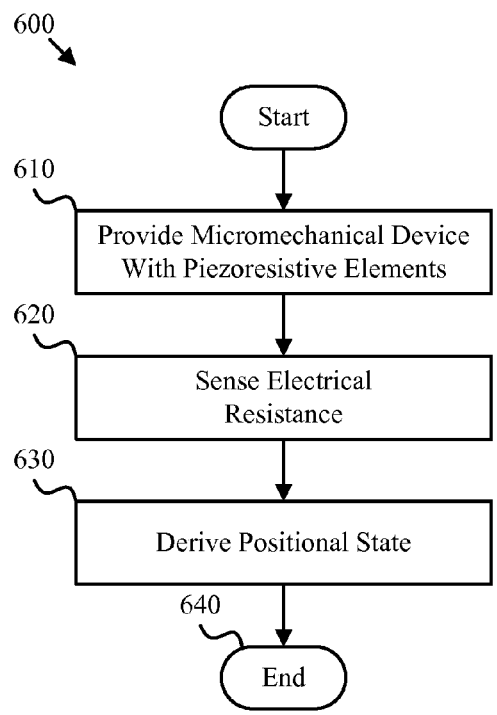
FIG. 6 is a flow chart diagram depicting one embodiment of a MEMS control method of the present invention.

FIG. 6 is a flow chart diagram depicting one embodiment of a MEMS control method 600 of the present invention. As depicted, the MEMS control method 600 includes providing 610 a piezoresistive micromechanical device, sensing 620 an electrical resistance, and deriving 630 a positional state. The MEMS control method 600 may be conducted in conjunction with the MEMS control system 300 depicted in FIG. 3.

Providing 610 a piezoresistive micromechanical device may include providing a micromechanical device 140 that includes one or more piezoresistive elements 345. Sensing 620 an electrical resistance may include measuring a response to a particular measurement signal. Deriving 630 a positional state may include processing the signal response to detect relative changes in resistance and mapping the response values to particular positional states. In certain embodiments, a mapping function is determined by executing a calibration sequence that places a micromechanical device in known positional states.

Figure 7:
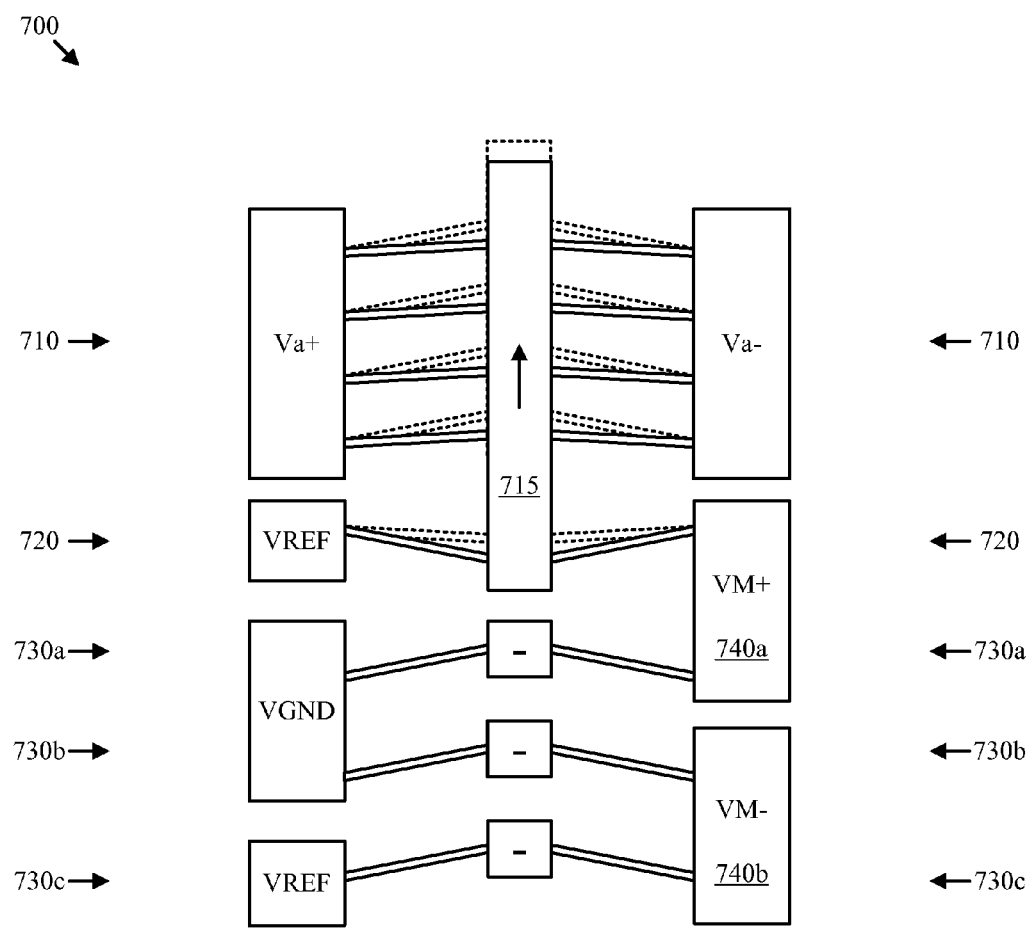
FIG. 7 is a layout diagram depicting one embodiment of a MEMS positional sensing device of the present invention integrated with a Wheatstone bridge sensing circuit.

FIG. 7 is a layout diagram depicting one embodiment of a MEMS positional sensing device 700 of the present invention integrated with a Wheatstone bridge sensing circuit. As depicted, the sensing device 700 includes a thermal actuator 710 with a moveable shuttle 715, an active device 720, and three reference devices 730. The depicted active device 720 and the reference devices 730 form a Wheatstone bridge circuit that facilitate providing a differential sensing voltage to the differential measurement pads 740. The use of a differential sensing voltage may increase the sensitivity of the positional sensing device 700.

The active device 720 may have an electrical resistance corresponding to the positional state of the movable shuttle 715. The depicted active device 720 and the reference device 730a form a voltage divider that is parallel to the voltage divider formed by the reference devices 730b and 730c. Each voltage divider should experience substantially similar noise conditions. As a result, the voltages provided to the measurement pads 740 may provide a differential signal that enables detection of small changes in electrical resistance associated with the active device 720. In certain embodiments, the differential signal is amplified by a differential amplifier (not shown) to provide a larger amplitude feedback signal to the control circuits 130, or the like. Using a Wheatstone bridge sensing circuit similar to the depicted circuit may be particularly useful for extremely small bistable devices such as MEMS memory devices.

Figure 8:
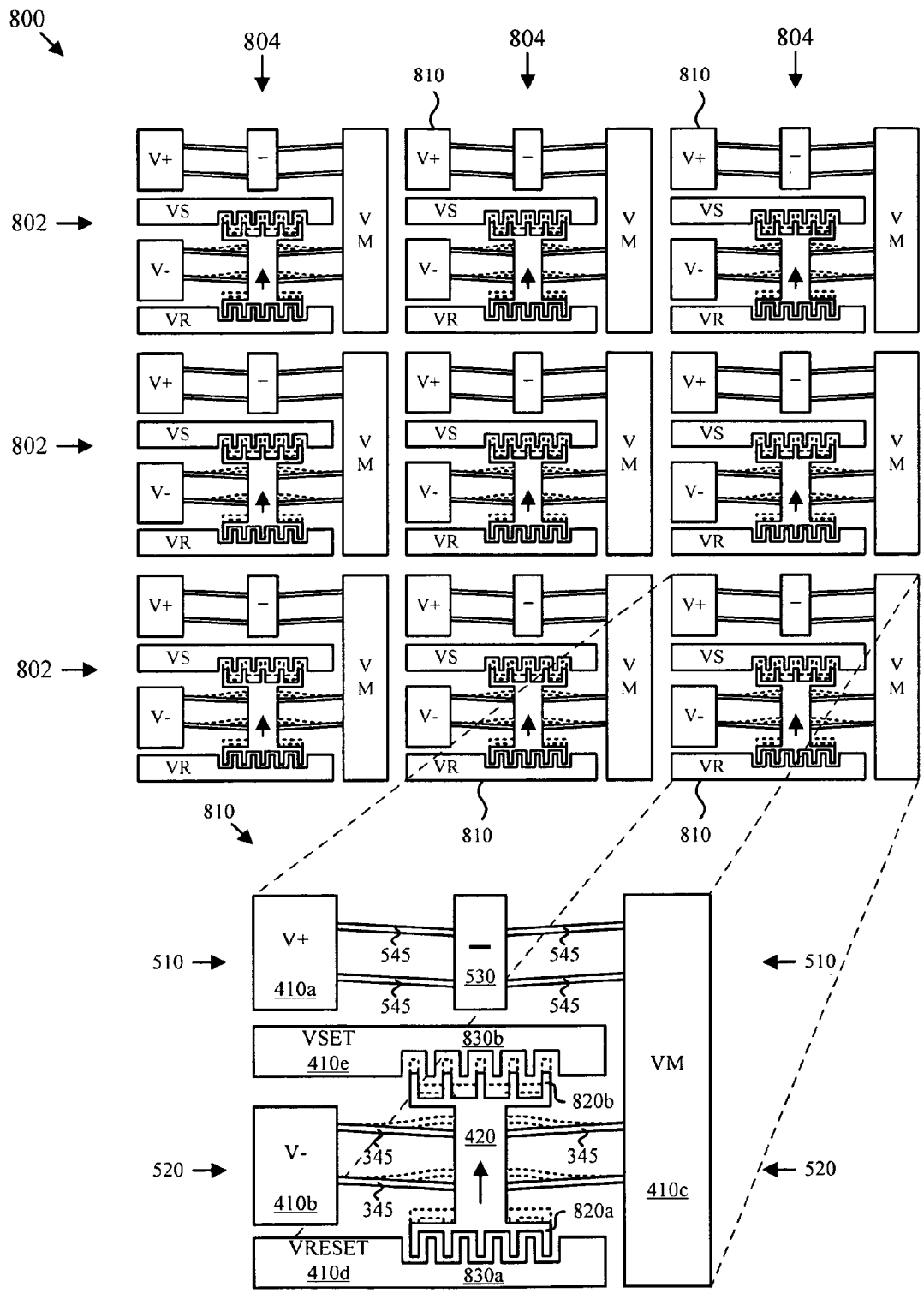
FIG. 8 is a layout diagram depicting one embodiment of a peak acceleration sensing array of the present invention.

FIG. 8 is a layout diagram depicting one embodiment of a sensing array 800 of the present invention. As depicted, the sensing array 800 includes a two dimensional array comprising rows 802 and columns 804 of bistable positional sensing devices 810. The depicted bistable positional sensing devices 810 are similar to the positional sensing device 500 depicted in FIG. 5. In one embodiment, each bistable sensing device 810 is a MEMS memory device. In another embodiment, each bistable sensing device 810 is a thresholded acceleration detector.

In addition to the elements described in conjunction with FIG. 5, the bistable positional sensing devices 810 may include one or more of electrostatic combs 820 attached to the movable shuttle 420 and corresponding combs 830 proximate to the combs 820. The electrostatic combs 820 and 830 facilitate moving the active device 510 to a selected positional state.

For example, by applying a sufficiently large voltage to pad 410d the electrostatic combs 820a and 830a may attract each other and induce a primary stable state illustrated with solid lines. Similarly, by applying a sufficiently large voltage to pad 410e electrostatic combs 820a and 830a may attract each other and induce a secondary stable state illustrated with dashed lines. Consequently, the positional state of the active device 510 may be selectively programmed. Furthermore, the positional state of each active device 510 may be detected by applying a voltage difference to pads 410a and 410b and measuring the voltage response at pad 410c.

In some embodiments, each positional sensing device 810 has a different sized movable shuttle 420 (i.e. shuttles of various masses) that requires a corresponding level of acceleration to move the shuttle from the primary stable state to the secondary stable state 440b (see FIG. 4). In those embodiments, the sensing array 800 may capture and retain a peak acceleration level experienced by the array. Furthermore, since power is only needed to read or reset the sensing devices 810, the information may be captured and retained without consuming power. In such embodiments, the combs 820b and 830b may not be necessary for valid operation and may be omitted from the positional sensing devices 810.

The present invention provides improved positional sensing of micromechanical devices. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A micromechanical apparatus comprising:
    a micromechanical device comprising a plurality of interacting elements formed of a particular piezoresistive material, the micro-mechanical device having substantially identical piezoresistive properties throughout each interacting element of the plurality of interacting elements;
    a sensing circuit configured to sense a bulk piezoresistance across at least one non-layered interacting element of the plurality of interacting elements and thereby sense a positional state of the micromechanical device.

2. The micromechanical apparatus of claim 1, wherein the micromechanical device comprises a movable shuttle having a first mechanically stable position and a second mechanically stable position, the micromechanical device configured to maintain the movable shuttle in either the first mechanically stable position or the second mechanically stable position without consuming power and without an electrostatic force acting on the micromechanical device.

3. The micromechanical apparatus of claim 2, further comprising an actuator configured to move a movable shuttle of a selected micromechanical device to a mechanically stable position.

4. The micromechanical apparatus of claim 2, wherein the movable shuttle has a mass that corresponds to an acceleration threshold and wherein an imposed acceleration that exceeds a the acceleration level will cause the movable shuttle to move from the first mechanically stable position to the second mechanically stable position.

5. A micromechanical system comprising:
    a plurality of micromechanical devices formed of a particular piezoresistive material and having substantially identical piezoresistive properties throughout each micromechanical device, each micromechanical device comprising a plurality of interacting elements; and
    at least one sensing circuit in electrical communication with the plurality of micromechanical devices, each sensing circuit thereof configured to sense a bulk piezoresistivity across at least one non-layered interacting element of the plurality of interacting elements of at least one micromechanical device of the plurality of micromechanical devices.

6. The micromechanical system of claim 5, wherein each micromechanical device comprises a movable shuttle having a first mechanically stable position and a second mechanically stable position, each micromechanical device configured to maintain the movable shuttle in either the first mechanically stable position or the second mechanically stable position without consuming power and without an electrostatic force acting on the micromechanical device.

7. The micromechanical system of claim 6, further comprising an actuator configured to move a movable shuttle of a micromechanical device to a mechanically stable position.

8. The micromechanical system of claim 6, wherein the movable shuttle of a micromechanical device has a mass that corresponds to an acceleration level, and wherein an imposed acceleration that exceeds the acceleration level will cause the movable shuttle to move from the first mechanically stable position to the second mechanically stable position.

* * * * *